United States Patent
Tanoue et al.

(10) Patent No.: US 7,235,304 B2
(45) Date of Patent: Jun. 26, 2007

(54) OPTICAL SENSOR

(75) Inventors: Hisao Tanoue, Ibaraki (JP); Yunosuke Makita, Ibaraki (JP); Zhengxin Liu, Ibaraki (JP); Yasuhiko Nakayama, Kanagawa (JP)

(73) Assignees: National Institute of Advanced Industrial Science and Technology, Tokyo (JP); Kankyo Semi-Conductors, Tokyo (JP)

( * ) Notice: Subject to any disclaimer, the term of this patent is extended or adjusted under 35 U.S.C. 154(b) by 0 days.

(21) Appl. No.: 10/973,251

(22) Filed: Oct. 27, 2004

(65) Prior Publication Data

US 2005/0087264 A1  Apr. 28, 2005

(30) Foreign Application Priority Data

Oct. 28, 2003 (JP) .............................. 2003-367771

(51) Int. Cl.
  *B32B 9/04* (2006.01)
(52) U.S. Cl. ...................... 428/446; 428/448; 428/698; 428/702; 428/704; 257/290
(58) Field of Classification Search ................ 428/446, 428/448, 698, 697, 704; 257/290
  See application file for complete search history.

(56) References Cited

U.S. PATENT DOCUMENTS

| | | | | |
|---|---|---|---|---|
| 4,782,377 A | * | 11/1988 | Mahan | 257/85 |
| 5,958,505 A | * | 9/1999 | Mantl | 438/225 |
| 6,288,415 B1 | * | 9/2001 | Leong et al. | 257/94 |
| 6,569,534 B2 | * | 5/2003 | Yamaguchi et al. | 428/446 |
| 6,835,959 B2 | * | 12/2004 | Ouchi | 257/79 |

FOREIGN PATENT DOCUMENTS

| | | | |
|---|---|---|---|
| DE | 41 36 511 A1 | | 11/1991 |
| GB | 2 318 680 A | | 10/1996 |
| JP | 2001-230443 A | | 2/2000 |
| JP | 2000312055 A | * | 11/2000 |
| JP | 2003046100 A | * | 2/2003 |
| JP | 2003243426 A | * | 8/2003 |

OTHER PUBLICATIONS

M. A. Lourenco et al., "Electroluminescence of β-FeSi₂ Light Emitting Devices", Jpn. J. Appl. Phys., vol. 40 (2001), pp. 4041-4044.

Yoshihito Maeda et al., "Effects of Uniaxial Lattice Deformation on Optical and Photoelectric Responses of IBS β-FeSi₂", Proceedings of Japan-UK Joint Workshop on Kankyo-Semiconductors, pp. 29-31.

(Continued)

*Primary Examiner*—Jennifer McNeil
*Assistant Examiner*—Timothy M. Speer
(74) *Attorney, Agent, or Firm*—Reed Smith LLP; Stanley P. Fisher, Esq.; Juan Carlos A. Marquez, Esq.

(57) ABSTRACT

An optical sensor that can receive light ranging from visible light to infrared light is provided. A thin beta-iron disilicide semiconductor film is formed on a silicon substrate. Light in the visible region is received by silicon, and light in the infrared region is received by beta-iron disilicide.

9 Claims, 1 Drawing Sheet

OTHER PUBLICATIONS

T. Suemasu et al., "Influence of Si Growth Temperature for Embedding β-FeSi$_2$ and Resultant Strain in β-FeSi$_2$ on Light Emission from p-Si/ β-FeSi$_2$ Particles/n-Si Light-Emitting Diodes", Applied Physics Letters, vol. 79, No. 12 (Sep. 17, 2001), pp. 1804-1806.

Shucheng Chu et al, "Room-Temperature 1.56 μm Electroluminescence of Highly Oriented β-FeSi$_2$/Si Single Heterojunction Prepared by Magnetron-Sputtering Deposition", Jpn. J. Appl. Phys., vol. 41 (2002), pp. L1200-L1202.

Shinan Wang et al., "Prototype Infrared Optical Sensor and Solar Cell Made of beta-FeSi$_2$ Thin Film", SPIE, vol. 5065, p. 188.

* cited by examiner

OPTICAL SENSOR

FIELD OF THE INVENTION

The present invention relates to an optical sensor, and more particularly to an optical sensor with the use of a semiconductor material.

BACKGROUND OF THE INVENTION

In recent years, the technology to transmit large amounts of information via optical communication has been developed reflecting the information age. At present, trunk lines of optical communication network have been installed with quartz fibers in the nation, and its extension to public facilities, factories, business offices, and further to private homes is being planned in the near future. For widespread availability of the optical fiber communication to every home, it is strongly desired to reduce its installation cost. There is a need for cost reduction in all of the optical fibers, communication modules, and optical parts. In order to meet this need, a system in which quartz fibers are not totally used but plastic optical fibers (POF) are partially used for short distance has emerged for local use among international lines, domestic trunk lines, urban communication network, office lines, and home lines. In other words, a large volume of data is transmitted to an urban relay station using quartz fibers, and the data is branched from there to transmit to every home using POF that is inexpensive and easy for installation and handling because of short distance.

Currently, the optical semiconductor sensor used for various optical devices includes materials such as starting with Si, Ge, Hg—Cd—Te system, In—Ga—As system, In—Ga—P system, and GaN.

Silicon (Si) is widely used for optical sensor because it is abundant in the earth, inexpensive, and low in environmental burden when disposed, its fabrication technology is well developed, and so on. Si has been playing an essential role in industrial fields since the twentieth century and has been widely used in accordance with the remarkable progress of technology. It has been used for not only optical sensor but also high-speed electric logic circuit, measurement sensor for various physical quantities, and switch.

However, Si can not be used for a light-receiving device for communication with quartz fibers. The wavelength of light for use in passing through quartz fibers is from 1.3 to 1.6 µm where transmission loss is minimized. Since the wavelength usable for Si ranges from visible light to 1.1 µm, transmission loss brought by using Si in quartz fiber communication is significant. In addition, Si has not a light-emitting property.

Accordingly, In—Ga—As system and In—Ga—P system having light-emitting and light-receiving properties are widely used for optical devices. These compound semiconductors utilize, however, elements such as As and In whose resource lives are very short in the earth. For example, although In is used for transparent electrodes (indium tin oxide, ITO) of plasma display as well, its resource life is expected to be about ten years from now, and that of As is also said to be at most that long. An element reserve is closely related to Clarke number. Elements with a larger Clarke number (light element with smaller element number) have been in contact with various living organisms on earth for long history and been incorporated into their bodies, and thus exhibit relatively high compatibility with living bodies. Moreover, these elements constitute substances that have lesser burden on the global environment. The above compound semiconductors are mainly composed of rare elements (In, As, Cd, Se, Hg) and many of these materials are high in toxicity and low in biocompatibility. The semiconductor materials to be frequently used in our society are desired to be made of elements with reduced burden on the environment from now on.

Beta-iron disilicide ($\beta$-$FeSi_2$) is reassessed as a representative material composed of elements that are abundant in the earth and ecologically friendly to the global environment, and has become desired for a post Group III-V or Group II-VI compound semiconductor material. $\beta$-$FeSi_2$ is a compound in which Fe and Si are combined in one to two ratio, and its crystal phase is stable up to 900 degrees C. or higher without any change. It is resistant to chemicals, and therefore resistant to both acid and alkaline agents, and its moisture resistance is also excellent. It has a physical property of a direct transition type semiconductor with an energy band gap of 0.85 eV, and is capable of light-emitting and light-receiving at a wavelength around 1.5 µm which lies in the region suitable for a communication part to be used for optical quartz fibers.

Furthermore, $\beta$-$FeSi_2$ is brought into a good lattice matching with Si by choosing an appropriate surface and orientation from studying its crystal constant, and a good epitaxial film of $\beta$-$FeSi_2$ can be grown on Si. When an optical device with $\beta$-$FeSi_2$ is fabricated, a conventional Si process is applied as it is, and thus its fabrication is amenable to industry.

Examples of the studies on $\beta$-$FeSi_2$ include light emission study in Non-patent document 1, light-receiving sensor study in Non-patent document 2, light emission studies in Non-patent documents 3 and 4, and further light-receiving sensor study in Non-patent document 5, and the like.

[Non-patent Document 1] M. A. Lourenco et al., Jpn. J. Appl. Phys., 40 (2001), 4041-4044

[Non-patent Document 2] Y. Maeda et al., Proc. Japan-UK Workshop on KANKYO-SEMICONDUCTORS, August. (2000), 29

[Non-patent Document 3] T. Suemasu et al., Appl. Phys. Lett., 79 (2001), 1804-1806.

[Non-patent Document 4] S. Chu et al., Jpn. J. Appl. Phys., 41 (2002), L1200-L1202.

[Non-patent Document 5] S. N. Wang, Proc. SPIE, 5065 (2003), 188

$\beta$-$FeSi_2$ has a light-receiving sensitivity in an infrared region of wavelengths ranging from 1.1 to 1.6 µm and has no light sensitivity in a visible region of wavelengths ranging from 0.4 to 1.1 µm.

SUMMARY OF THE INVENTION

The purpose of the present invention is to provide an optical device that has a light-receiving sensitivity in a range from visible wavelengths of from 0.4 to 1.1 µm to infrared wavelengths of from 1.1 to 1.6 µm and that is inexpensive and ecologically friendly to the environment.

The optical sensor of the present invention is composed of a Si substrate and a semiconductor chip provided with a thin film of $\beta$-$FeSi_2$ formed on the substrate. Si receives light in visible region of wavelengths ranging from 0.4 to 1.1 µm, and $\beta$-$FeSi_2$ receives in infrared of wavelengths from 1.1 µm to 1.6 µm. Therefore, the optical sensor of the present invention changes not only visible light but also infrared light to electronic signals.

When Fe and Si are deposited on a heated Si substrate, Fe and Si react by heat, and $\beta$-$FeSi_2$ is grown expitaxially.

When a junction interface is formed between the Si substrate and the β-FeSi$_2$ film, Fe diffusion that is diffusion of Fe atoms into Si occurs at the interface, resulting in deterioration in properties of the sensor. In the present invention, a buffer layer to prevent the Fe diffusion is provided between the Si substrate and the β-FeSi$_2$ film.

According to the optical sensor of the present invention, it is possible to detect light with wavelengths in visible to infrared region.

DETAILED DESCRIPTION OF THE PREFERRED EMBODIMENTS

First Embodiment

Figure 1:
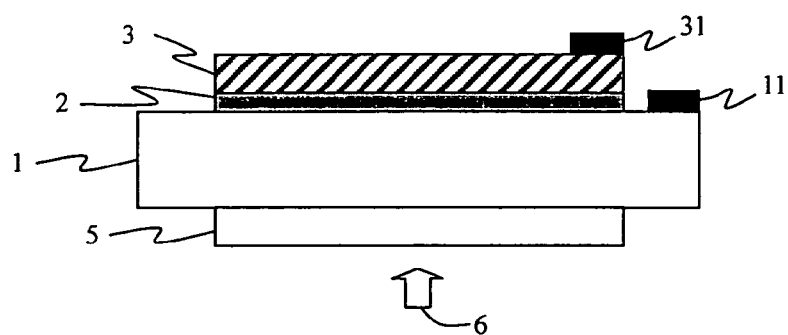
FIG. 1 is a diagram to show a structure of a first embodiment of the optical sensor according to the present invention.

A first embodiment of the optical sensor of the present invention is explained with reference to FIG. 1. The optical sensor of the present embodiment is provided with a silicon (Si) substrate 1, a buffer layer to prevent Fe diffusion 2 on one surface of the Si substrate 1, a beta-iron disilicide (β-FeSi$_2$) film 3 on top of the buffer layer 2, and a non-reflective dielectric layer 5 on the other surface of the Si substrate 1. An electrode 11 is provided on the Si substrate 1, and another electrode 31 is provided on the β-FeSi$_2$ film 3.

The Si substrate 1 is composed of p-type Si. The β-FeSi$_2$ film 3 is composed of n-type β-FeSi$_2$. The buffer layer to prevent Fe diffusion 2 is composed of a thin silicon dioxide (SiO$_2$) or titanium nitride (TiN) film. The non-reflective dielectric layer 5 is composed of a Zn(S,O) (a mixture of ZnO and ZnS), ZnO, SiO$_2$, or indium tin oxide (ITO) film or a multi-layer film in combination of these thin films.

A fabrication experiment of the first embodiment of the optical sensor carried out by the present inventors is explained. The following conditions of a first experiment indicate those of the fabrication experiment of the first embodiment of the optical sensor of the present invention carried out by the present inventors.

The conditions of the first experiment

| | |
|---|---|
| Degree of vacuum in vacuum chamber: | $10^{-8}$ to $10^{-10}$ torr |
| Substrate material and temperature: | p-type Si; 300 to 600 degrees C. |
| Material and film thickness of buffer layer: | SiO$_2$; 10 nm or smaller |
| β-FeSi$_2$ film: | Si; 406 nm, Fe; 120 nm n-β-FeSi$_2$ after reaction; 383 nm |
| Non-reflective dielectric layer: | ZnO; 600 nm, SiO$_2$; 270 nm |

First, a thin SiO$_2$ film in a film thickness of 10 nm or smaller was deposited on the surface of the p-type Si substrate 1 using a sputtering apparatus to form the buffer layer to prevent Fe diffusion 2. The Si substrate 1 having the buffer layer to prevent Fe diffusion 2 formed thereon was heated at a temperature ranging from 300 to 600 degrees C. in a high vacuum chamber at $10^{-8}$ to $10^{-10}$ torr, and Si containing an impurity (P or Co) for conversion to n-type and Fe were deposited by irradiation, respectively. In this way, a Si film in a film thickness of 406 nm and an Fe film in a film thickness of 120 nm were formed respectively. Si and Fe were reacted by heat, and the n-type β-FeSi$_2$ film 3 was grown epitaxially. The film thickness of the formed n-type β-FeSi$_2$ film 3 was 383 nm.

Next, a ZnO film in a film thickness of 600 nm and a SiO$_2$ film in a film thickness of 270 nm were formed, respectively, by sputtering on the other surface of the Si substrate 1 opposite to that having the fabricated β-FeSi$_2$ film to form the non-reflective dielectric layer 5.

Finally, part of the β-FeSi$_2$ film 3 was removed by etching, and the electrode 11 was attached to the exposed Si substrate by a vapor deposition method. In a similar way, the electrode 31 was attached to the surface of the β-FeSi$_2$ film 3 by the vapor deposition method. The fabrication of the optical sensor was completed by bonding lead wires to the electrodes 11 and 31.

As illustrated, when a laser light having a wavelength of 0.85 μm as an incident light 6 was irradiated from the side of the non-reflective dielectric layer 5, an output voltage was generated between the two electrodes 11 and 31. Similarly, when a laser light having a wavelength of 1.5 μm was irradiated, an output voltage was generated between the electrodes 11 and 31.

In the fabrication process of the optical sensor of the present embodiment, the number of process steps is smaller, resulting in cost savings, because only one layer of the β-FeSi$_2$ film is grown epitaxially on the Si substrate. Fe diffuses with ease into the Si substrate during the heat treatment for forming β-FeSi$_2$ on the Si substrate. When Fe diffuses into the Si substrate, electric properties of the junction surface deteriorate, and photoelectric output is decreased. The diffusion of Fe into the Si substrate was prevented by providing the buffer layer to prevent Fe diffusion 2 in the present embodiment.

Second Embodiment

Figure 2:
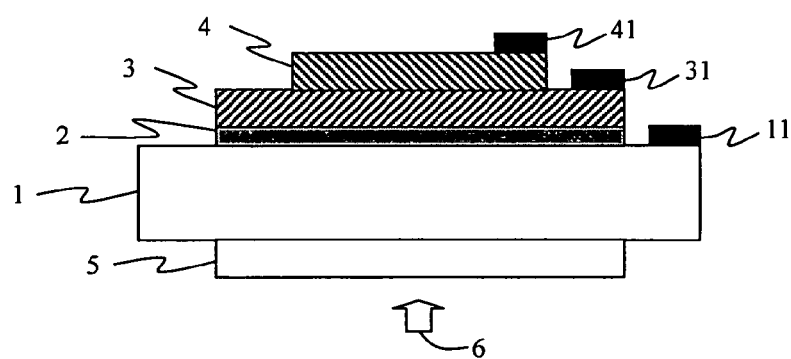
FIG. 2 is a diagram to show a structure of a second embodiment of the optical sensor according to the present invention.

A second embodiment of the optical sensor of the present invention is explained with reference to FIG. 2. The optical sensor of the present embodiment is provided with the Si substrate 1, the buffer layer to prevent Fe diffusion 2 on one surface of the Si substrate, the first β-FeSi$_2$ film 3 on the buffer layer 2, a second β-FeSi$_2$ film 4 on top of the first β-FeSi$_2$ film 3, and the non-reflective dielectric layer 5 on the other surface of the Si substrate 1. The electrode 11 is provided on the Si substrate 1, and the electrode 31 and another electrode 41 are provided on the first and second β-FeSi$_2$ films, respectively.

The Si substrate 1 is composed of n-type Si. The first β-FeSi$_2$ film 3 is composed of n-type β-FeSi$_2$ and the second β-FeSi$_2$ film 4 is composed of p-type β-FeSi$_2$. The buffer layer to prevent Fe diffusion 2 is composed of a thin SiO$_2$ or TiN film. The non-reflective dielectric layer is composed of a Zn(S,O), ZnO, SiO$_2$, or ITO film or a multi-layer film in combination of these thin films.

A fabrication experiment of the second embodiment of the optical sensor carried out by the present inventors is explained. The following conditions of a second experiment indicate those of the fabrication experiment of the second embodiment of the optical sensor of the present invention carried out by the present inventors.

The conditions of the second experiment

| | |
|---|---|
| Degree of vacuum in vacuum chamber: | $10^{-8}$ to $10^{-10}$ torr |
| Substrate material and temperature: | n-type Si; 300 to 600 degrees C. |
| Material and film thickness of buffer layer: | $SiO_2$; 10 nm or smaller |
| First β-$FeSi_2$ film: | Si; 237 nm, Fe; 70 nm n-β-$FeSi_2$ after reaction; 223 nm |
| Second β-$FeSi_2$ film: | Si; 406 nm, Fe; 120 nm p-β-$FeSi_2$ after reaction; 383 nm |
| Non-reflective dielectric layer: | ZnO; 600 nm, $SiO_2$; 270 nm |

First, a thin $SiO_2$ film in a film thickness of 10 nm or smaller was deposited on the surface of the n-type Si substrate 1 using a sputtering apparatus to form the buffer layer to prevent Fe diffusion 2. The Si substrate 1 having the buffer layer to prevent Fe diffusion 2 formed thereon was heated at a temperature ranging from 300 to 600 degrees C. in a high vacuum chamber at $10^{-8}$ to $10^{-10}$ torr, and Si containing an impurity (P) for conversion to n-type and Fe were deposited by irradiation, respectively. In this way, a Si film in a film thickness of 237 nm and an Fe film in a film thickness of 70 nm were formed respectively. Si and Fe were reacted by heat, and the n-type β-$FeSi_2$ film 3 was grown epitaxially. The film thickness of the formed n-type β-$FeSi_2$ film 3 was 223 nm.

Next, the Si substrate 1 having the β-$FeSi_2$ film 3 formed thereon was heated again at a temperature ranging from 450 to 600 degrees C. in the high vacuum chamber at $10^{-8}$ to $10^{-10}$ torr, and Si containing an impurity (Ga) for conversion to p-type and Fe were deposited by irradiation, respectively. In this way, a Si film in a film thickness of 406 nm and an Fe film in a film thickness of 120 nm were formed respectively. Si and Fe were reacted by heat, and the p-type β-$FeSi_2$ film 4 was grown epitaxially. An n/p-junction interface was formed between the first β-$FeSi_2$ film 3 and the second β-$FeSi_2$ film 4. The film thickness of the formed p-type β-$FeSi_2$ film 4 was 383 nm.

Then, a ZnO film in a film thickness of 600 nm and a $SiO_2$ film in a film thickness of 270 nm were formed, respectively, by sputtering on the other surface of the Si substrate 1 opposite to that having the fabricated β-$FeSi_2$ films 3 and 4 to form the non-reflective dielectric layer 5.

Finally, part of the buffer layer to prevent Fe diffusion 2 was removed by etching, and the electrode 11 was attached to the exposed Si substrate by a vapor deposition method. In a similar way, the electrode 31 and another electrode 41 were attached to the surfaces of the first and second β-$FeSi_2$ films 3 and 4, respectively, by the vapor deposition method. The fabrication of the optical sensor was completed by bonding lead wires to the electrodes 11, 31, and 41.

As illustrated, when a laser light having a wavelength of 0.85 μm as the incident light 6 was irradiated from the side of the non-reflective dielectric layer 5, an output voltage was generated only between the two electrodes 11 and 31. No output voltage was generated between the electrodes 31 and 41 and between the electrodes 11 and 41. Similarly, when a laser light having a wavelength of 1.5 μm was irradiated, an output voltage was generated only between the two electrodes 31 and 41. No output voltage was generated between other combinations of the electrodes.

In the fabrication process of the optical sensor of the present embodiment, the number of process steps is increased because two layers of the β-$FeSi_2$ films are grown epitaxially on the Si substrate. However, excellent junction can be easily formed, since both have a homo-structure of β-$FeSi_2$.

Third Embodiment

Figure 3:
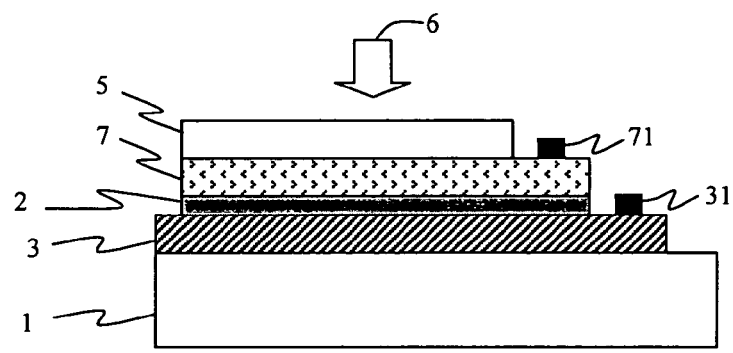
FIG. 3 is a diagram to show a structure of a third embodiment of the optical sensor according to the present invention.

A third embodiment of the optical sensor of the present invention is explained with reference to FIG. 3. The optical sensor of the present embodiment is provided with the Si substrate 1, the β-$FeSi_2$ film 3 on one surface of the Si substrate, the buffer layer to prevent Fe diffusion 2 on the β-$FeSi_2$ film 3, a Si film 7 thereon, and the non-reflective dielectric layer 5 further thereon. The electrode 31 is provided on the β-$FeSi_2$ film 3, and another electrode 71 is provided on the Si film 7.

The Si substrate 1 is composed of n-type Si. The β-$FeSi_2$ film 3 is composed of p-type β-$FeSi_2$. The Si film 7 is composed of n-type Si. The buffer layer to prevent Fe diffusion 2 is composed of a thin $SiO_2$ or TiN film. The non-reflective dielectric layer is composed of a Zn(S,O), ZnO, $SiO_2$, or ITO film or a multi-layer film in combination of these thin films.

A fabrication experiment of the third embodiment of the optical sensor carried out by the present inventors is explained. The following conditions of a third experiment indicate those of the fabrication experiment of the third embodiment of the optical sensor of the present invention carried out by the present inventors.

The conditions of the third experiment

| | |
|---|---|
| Degree of vacuum in vacuum chamber: | $10^{-8}$ to $10^{-10}$ torr |
| Substrate material and temperature: | n-type Si; 300 to 600 degrees C. |
| β-$FeSi_2$ film: | Si; 406 nm, Fe; 120 nm p-β-$FeSi_2$ after reaction; 383 nm |
| Material and film thickness of buffer layer: | $SiO_2$; 10 nm or smaller |
| Si film | n-Si; 406 nm |
| Non-reflective dielectric layer: | ZnO; 600 nm, $SiO_2$; 270 nm |

First, Si containing an impurity (Ga) for conversion to p-type and Fe were deposited by irradiation on the surface of the n-type Si substrate at the same time. In this way, a Si film in a film thickness of 406 nm and an Fe film in a film thickness of 120 nm were formed respectively. Si and Fe were reacted by heat, and the p-type β-$FeSi_2$ film 3 was grown epitaxially. The film thickness of the formed p-type β-$FeSi_2$ film 3 was 383 nm. Next, a thin $SiO_2$ film in a film thickness of 10 nm or smaller was deposited on the surface of the β-$FeSi_2$ film 3 fabricated on the Si substrate 1 using a sputtering apparatus to form the buffer layer to prevent Fe diffusion 2. The Si substrate 1 having the formed buffer layer to prevent Fe diffusion 2 was again heated at a temperature ranging from 300 and 600 degrees C. in a high vacuum chamber at $10^{-8}$ to $10^{-10}$ torr, and Si containing an impurity (P) for conversion to n-type was deposited thereon by irradiation. After reaction of Si by heat, the n-type Si film 7 was grown epitaxially. In this way, an n/p-junction interface was formed between the Si film 7 and the β-$FeSi_2$ film 3. The film thickness of the formed n-type Si film 7 was 406 nm.

Then, a ZnO film in a film thickness of 600 nm and a $SiO_2$ film in a film thickness of 270 nm were formed, respectively, by sputtering on the surface of the n-type Si film 7 fabricated on the top of the Si substrate 1 to form the non-reflective dielectric layer 5.

Finally, the electrodes 31 and 71 were attached on the surfaces of the β-FeSi$_2$ film 3 and the Si film 7, respectively, by a vapor deposition method. The fabrication of the optical sensor was completed by bonding lead wires to the electrodes 31 and 71.

As illustrated, when a laser light having a wavelength of 0.85 μm as the incident light 6 was irradiated from the side of the non-reflective dielectric layer 5, an output voltage was generated between the two electrodes 31 and 71. Similarly, when a laser light having a wavelength of 1.5 μm was irradiated, an output voltage was generated between the two electrodes 31 and 71.

The fabrication process of the optical sensor of the present embodiment is easy because all of the films are fabricated on one surface of the Si substrate. In addition, since the infrared light is received by the β-FeSi$_2$ film after passing through the relatively thin Si substrate 7 in the optical sensor of the present embodiment, the amount of light received by the β-FeSi$_2$ film is larger compared with the case where the light is received by the β-FeSi$_2$ film after passing through the Si substrate 1 as described in the foregoing embodiments.

Figure 4:
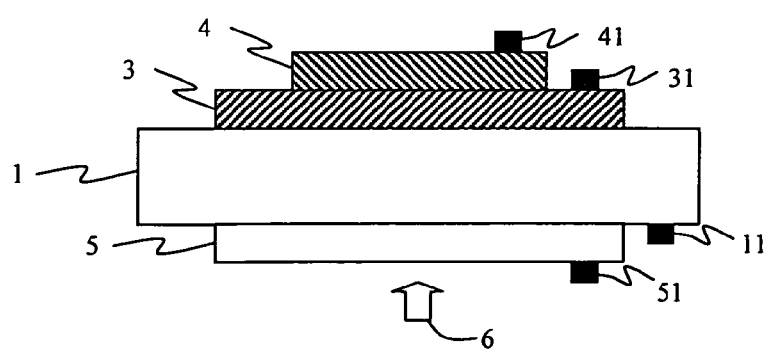
FIG. 4 is a diagram to show a structure of a fourth embodiment of the optical sensor according to the present invention.

A fourth embodiment of the optical sensor of the present invention is explained with reference to FIG. 4. The optical sensor of the present embodiment is provided with the Si substrate 1, the first β-FeSi$_2$ film 3 on one surface of the substrate, the second β-FeSi$_2$ film 4 on top of the first β-FeSi$_2$ film 3, and the non-reflective dielectric layer 5 on the other surface of the Si substrate 1. The electrode 11 is provided on the Si substrate 1, and the electrodes 31 and 41 are provided on the first and second β-FeSi$_2$ films 3 and 4, respectively. An electrode 51 is provided on the non-reflective dielectric layer 5.

The Si substrate 1 is composed of p-type Si. The first β-FeSi$_2$ film 3 is composed of n-type β-FeSi$_2$ and the second β-FeSi$_2$ film 4 is composed of p-type β-FeSi$_2$. The non-reflective dielectric layer 5 is a thin Zn(S,O) film. The Zn(S,O) film is an n-type semiconductor.

Fourth Embodiment

A fabrication experiment of the fourth embodiment of the optical sensor carried out by the present inventors is explained. The following conditions of a fourth experiment indicate those of the fabrication experiment of the fourth embodiment of the optical sensor of the present invention carried out by the present inventors.

The conditions of the fourth experiment

| | |
|---|---|
| Degree of vacuum in vacuum chamber: | $10^{-8}$ to $10^{-10}$ torr |
| Substrate material and temperature: | p-type Si; 450 to 600 degrees C. |
| First β-FeSi$_2$ film: | Si; 237 nm, Fe; 70 nm n-β-FeSi$_2$ after reaction; 223 nm |
| Second β-FeSi$_2$ film: | Si; 406 nm, Fe; 120 nm p-β-FeSi$_2$ after reaction; 383 nm |
| Non-reflective dielectric layer: | n-Zn(S, O); 100 nm |

First, the p-type Si substrate 1 was heated at a temperature ranging from 450 to 600 degrees C. in a high vacuum chamber at $10^{-8}$ to $10^{-1}$ torr, and Si containing an impurity (P) for conversion to n-type and Fe were deposited thereon by irradiation, respectively. In this way, a Si film in a film thickness of 237 nm and an Fe film in a film thickness of 70 nm were formed respectively. Si and Fe were reacted by heat, and the n-type β-FeSi$_2$ film 3 was grown epitaxially. The film thickness of the formed n-type β-FeSi$_2$ film 3 was 223 nm.

Next, the Si substrate 1 having the β-FeSi$_2$ film 3 formed thereon was heated again at a temperature ranging from 450 to 600 degrees C. in the high vacuum chamber at $10^{-8}$ to $10^{-10}$ torr, and Si containing an impurity (Ga) for conversion to p-type and Fe were deposited by irradiation, respectively. In this way, a Si film in a film thickness of 406 nm and an Fe film in a film thickness of 120 nm were formed respectively. Si and Fe were reacted by heat, and the p-type β-FeSi$_2$ film 4 was grown epitaxially. An n/p-junction interface was formed between the first β-FeSi$_2$ film 3 and the second β-FeSi$_2$ film 4. The film thickness of the formed p-type β-FeSi$_2$ film 4 was 383 nm.

Then, a Zn(S,O) film in a film thickness of 100 nm was formed by a chemical solution deposition method on the surface of the Si substrate 1 opposite to that having the fabricated β-FeSi$_2$ films 3 and 4 to form the non-reflective dielectric layer 5.

Finally, the electrode 11 was attached to the exposed Si substrate by a vapor deposition method. In a similar way, the electrodes 31 and 41 and another electrode 51 were attached to the surfaces of the first and second β-FeSi$_2$ films 3 and 4, and the non-reflective dielectric layer 5, respectively, by the vapor deposition method. The fabrication of the optical sensor was completed by bonding lead wires to the electrodes 11, 31, 41, and 51.

As illustrated, when a laser light having a wavelength of 0.85 μm as the incident light 6 was irradiated from the side of the non-reflective dielectric layer 5, an output voltage was generated only between the two electrodes 11 and 41. No output voltage was generated between other combinations of the electrodes. Similarly, when a laser light having a wavelength of 1.5 μm was irradiated, an output voltage was generated only between the two electrodes 31 and 41. No output voltage was generated between other combinations of the electrodes.

According to the optical sensor of the present embodiment, the Zn(S,O) film fabricated on the surface of the p-type Si substrate serves as an n-type semiconductor and forms a p/n junction at the interface with the substrate. Further, this Zn(S,O) film serves as the transparent dielectric layer and plays the combined role of a semiconductor film and a non-reflective protective film. Accordingly, it becomes unnecessary to fabricate additional non-reflective film such as SiO$_2$ film, thereby allowing to decrease the number of fabrication process steps and achieve low cost.

In the optical sensor of the present embodiment, the light-receiving portion of Si and the light-receiving portion of β-FeSi$_2$ are independently and separately fabricated, and therefore, 1.5 μm and 0.85 μm laser signals can be taken out without being mixed.

The embodiments of the present invention have been explained in the foregoing. However, the present invention is not limited to the above embodiments, and it should be understood with ease that a variety of modifications are apparent to one of ordinary skill in the art. Such modifications can be made without departing from the scope of the present invention as defined in the appended claims.

What is claimed is:

1. An optical sensor, comprising:
a silicon (Si) substrate; and
a beta-iron disilicide (β-FeSi$_2$) film formed on the substrate,
wherein a p-type/n- type junction interface is formed between the substrate and the beta-iron disilicide film, a buffer layer to prevent Fe diffusion from the beta-iron disilicide film into the substrate is provided between the substrate and the beta-iron disilicide film, the thickness of the buffer layer is equal to or less than 10 nm, and the buffer layer is composed of $SiO_2$ or TiN.

2. The optical sensor according to claim 1, wherein a non-reflective dielectric film is provided on the surface of the substrate opposite to the beta-iron disilicide film.

3. An optical sensor, comprising:

a silicon (Si) substrate; and a beta-iron disilicide ($\beta$-$FeSi_2$) film formed on the substrate, wherein a p-type/n- type junction interface is formed between the substrate and the beta-iron disilicide film, a buffer layer to prevent Fe diffusion from the beta-iron disilicide film into the substrate is provided between the substrate and the beta-iron disilicide film, and a non-reflective dielectric film is provided on the surface of the substrate opposite to the beta-iron disilicide film.

4. The optical sensor according to claim 3, wherein the non-reflective dielectric film includes a Zn(S,O), $SiO_2$, or ITO film or a multi-layer film in combination of these thin films.

5. An optical sensor, comprising:

a silicon (Si) substrate;

a beta-iron disilicide ($\beta$-$FeSi_2$) film formed on the substrate; and a silicon (Si) film formed on the beta-iron disilicide film, wherein a p-type/n- type junction interface is formed between the beta-iron disilicide ($\beta$-$FeSi_2$) film and the silicon (Si) film, a buffer layer to prevent Fe diffusion from the beta-iron disilicide film into the substrate is provided between the beta-iron disilicide ($\beta$-$FeSi_2$) film and the silicon (Si) film, and a non-reflective dielectric film is provided on the silicon film.

6. The optical sensor according to claim 5, wherein the non-reflective dielectric film includes a Zn(S,O), $SiO_2$, or ITO film or a multi-layer film in combination of these thin films.

7. An optical sensor, comprising:

a silicon substrate;

a first beta-iron disilicide ($\beta$-$FeSi_2$) film formed on the substrate; and a second beta-iron disilicide ($\beta$-$FeSi_2$) film formed on the first beta-iron disilicide ($\beta$-$FeSi_2$) film, wherein an n-type/p-type junction interface or a p-type/n-type junction interface is formed between the substrate and the first beta-iron disilicide ($\beta$-$FeSi_2$) film and between the first and the second beta-iron disilicide ($\beta$-$FeSi_2$) films, respectively; and a non-reflective dielectric film is provided on the surface of the substrate opposite to the first and second beta-iron disilicide films.

8. The optical sensor according to claim 7, wherein a layer composed of Zn(S,O) is provided on the surface of the substrate opposite to the first and second beta-iron disilicide films.

9. An optical sensor, comprising:

a silicon (Si) substrate;

a first beta-iron disilicide ($\beta$-$FeSi_2$) film formed on the substrate; and a second beta-iron disilicide ($\beta$-$FeSi_2$) film is formed on the first beta-iron disilicide film, wherein a p-type/n- type junction interface is formed between the substrate and the first beta-iron disilicide film, an n-type/p-type junction interface or a p-type/n-type junction interface is formed between the first beta-iron disilicide film and the second beta-iron disilicide film, a buffer layer to prevent Fe diffusion from the first beta-iron disilicide film into the substrate is provided between the substrate and the first beta-iron disilicide film, and the thickness of the buffer layer is equal to or less than 10 nm.

* * * * *